(12) United States Patent
Edwards et al.

(10) Patent No.: US 9,000,505 B2
(45) Date of Patent: Apr. 7, 2015

(54) QUANTUM ELECTRO-OPTICAL DEVICE USING CMOS TRANSISTOR WITH REVERSE POLARITY DRAIN IMPLANT

(75) Inventors: Henry L. Edwards, Garland, TX (US); Tathagata Chatterjee, Allen, TX (US); Robert C. Bowen, Mt. Laurel, NJ (US)

(73) Assignee: Texas Instruments Incorporated, Dallas, TX (US)

(*) Notice: Subject to any disclaimer, the term of this patent is extended or adjusted under 35 U.S.C. 154(b) by 390 days.

(21) Appl. No.: 13/219,230

(22) Filed: Aug. 26, 2011

(65) Prior Publication Data

US 2012/0098590 A1  Apr. 26, 2012

Related U.S. Application Data

(60) Provisional application No. 61/405,085, filed on Oct. 20, 2010.

(51) Int. Cl.
| | | |
|---|---|---|
| *H01L 21/336* | (2006.01) | |
| *H01L 21/8234* | (2006.01) | |
| *H01L 29/78* | (2006.01) | |
| *H01L 21/8238* | (2006.01) | |
| *H01L 21/265* | (2006.01) | |
| *H01L 29/10* | (2006.01) | |

(52) U.S. Cl.
CPC .. *H01L 21/823814* (2013.01); *H01L 21/26586* (2013.01); *H01L 29/1083* (2013.01); *H01L 29/7833* (2013.01)

(58) Field of Classification Search
CPC .................. H01L 21/823814; H01L 29/7833
See application file for complete search history.

(56) References Cited

U.S. PATENT DOCUMENTS

2009/0057651 A1* 3/2009 Edwards et al. ................ 257/24
2010/0038713 A1* 2/2010 Majhi et al. .................... 257/344

* cited by examiner

*Primary Examiner* — Marcos D Pizarro
(74) *Attorney, Agent, or Firm* — John R. Pessetto; Frank D. Cimino

(57) ABSTRACT

A CMOS IC containing a quantum well electro-optical device (QWEOD) is disclosed. The QWEOD is formed in an NMOS transistor structure with a p-type drain region. The NLDD region abutting the p-type drain region forms a quantum well. The QWEOD may be fabricated with 65 nm technology node processes to have lateral dimensions less than 15 nm, enabling possible energy level separations above 50 meV. The quantum well electro-optical device may be operated in a negative conductance mode, in a photon emission mode or in a photo detection mode.

1 Claim, 10 Drawing Sheets

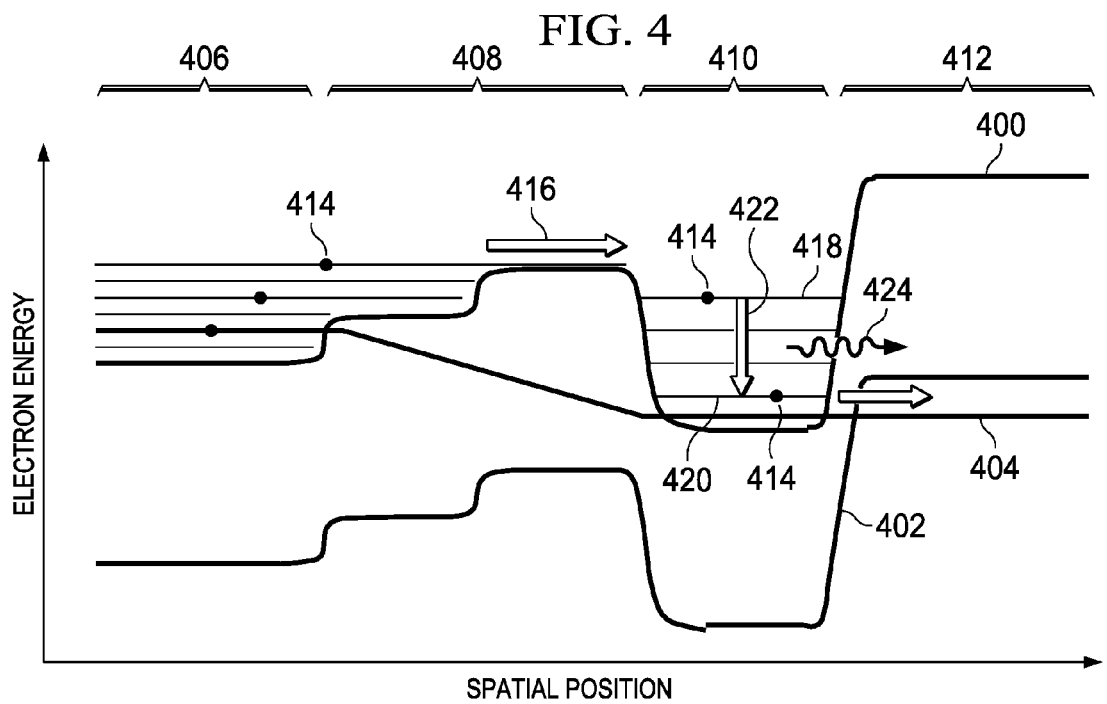
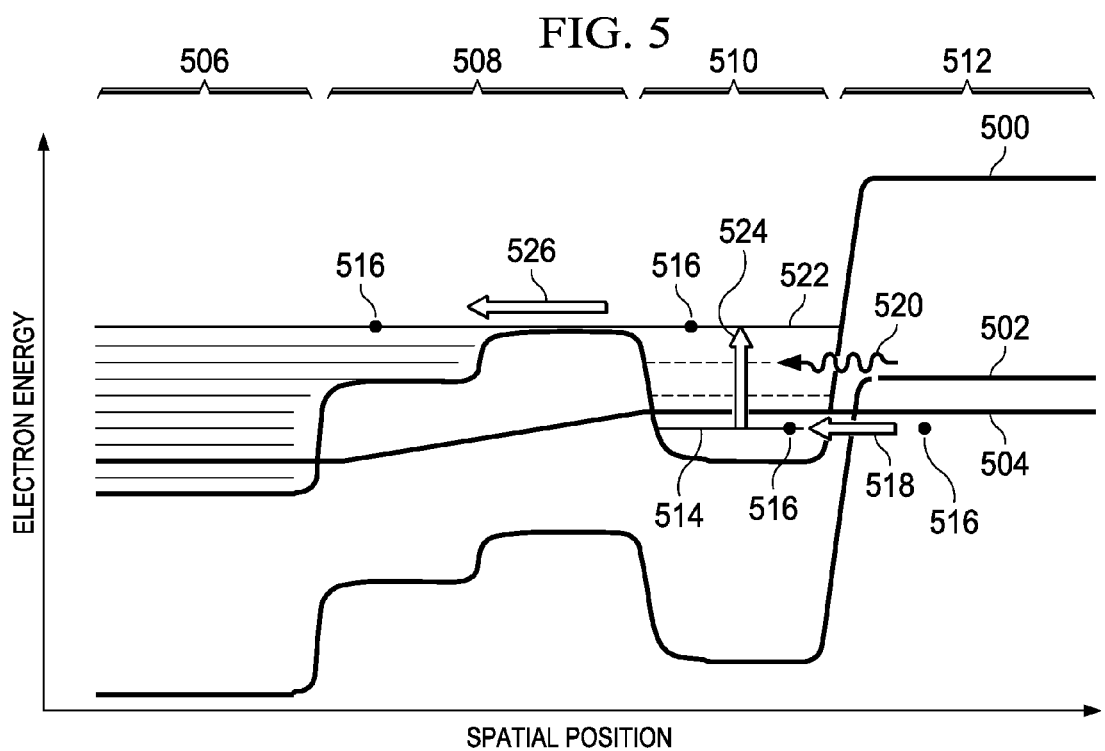

QUANTUM ELECTRO-OPTICAL DEVICE USING CMOS TRANSISTOR WITH REVERSE POLARITY DRAIN IMPLANT

CROSS-REFERENCE TO RELATED APPLICATIONS

This application is a nonprovisional that claims priority from U.S. Provisional Application No. 61/405,085, filed Oct. 20, 2010, which is hereby incorporated by reference for all purposes.

FIELD OF THE INVENTION

This invention relates to the field of integrated circuits (ICs). More particularly, this invention relates to quantum electro-optical devices in ICs.

BACKGROUND OF THE INVENTION

Electro-optical devices based on quantum wells offer advantages over conventional electro-optical devices based on bulk semiconductor properties. Integrating quantum well electro-optical devices in silicon ICs which feature energy level separations greater than 50 meV to allow operation at room temperature has been problematic.

SUMMARY OF THE INVENTION

In accordance with an embodiment of the present invention, an integrated circuit (IC) is provided. The IC comprises a p-type substrate; a gate dielectric layer formed on a top surface of the substrate; a gate formed on a top surface of the gate dielectric layer; an n-type source region formed in the substrate adjacent to and on one side of the gate; an n-type quantum well region formed in the substrate adjacent to the gate on an opposite side of the gate from the source region; and a p-type drain region formed in the substrate abutting the quantum well region on an opposite side of the quantum well region from the gate.

In accordance with an embodiment of the present invention, the IC further comprises a p-type halo region with a doping density between $1 \cdot 10^{17}$ and $1 \cdot 10^{18}$ cm$^{-3}$ formed in the substrate under the gate and abutting the quantum well region.

In accordance with an embodiment of the present invention, a width of the quantum well region is less than 15 nanometers.

In accordance with an embodiment of the present invention, a doping density of the quantum well region is above $1 \cdot 10^{19}$ cm$^{-3}$.

In accordance with an embodiment of the present invention, a first electron energy state in the quantum well region is separated from a second electron energy state in the quantum well region by more than 50 meV.

In accordance with an embodiment of the present invention, the IC further comprises a gate sidewall spacer on a lateral surface of the gate overlapping the drain region, whereby a lateral boundary of the drain region is defined on one side by a boundary of the gate sidewall spacer.

In accordance with an embodiment of the present invention, a length of the quantum well region is less than 15 nanometers.

In accordance with an embodiment of the present invention, the IC further comprises a second n-type quantum well region formed in the substrate adjacent to the gate on an opposite side of the gate from the source region, such that the p-type drain region abuts the second n-type quantum well region.

In accordance with an embodiment of the present invention, a length of the quantum well region is more than 50 nanometers.

In accordance with an embodiment of the present invention, a method is provided. The method comprises providing a p-type substrate; forming a gate dielectric layer on a top surface of the substrate; forming a gate on a top surface of the gate dielectric layer; forming an n-type source region in the substrate adjacent to and on one side of the gate; forming an n-type quantum well region in the substrate adjacent to the gate on an opposite side of the gate from the source region; and forming a p-type drain region in the substrate abutting the quantum well region on an opposite side of the quantum well region from the gate.

In accordance with an embodiment of the present invention, the method further comprises the step of forming a p-type halo region with a doping density between $1 \cdot 10^{17}$ and $1 \cdot 10^{18}$ cm$^{-3}$ in the substrate under the gate and abutting the quantum well region.

In accordance with an embodiment of the present invention, the step of forming the quantum well region is performed such that a doping density of the quantum well region is above $1 \cdot 10^{19}$ cm$^{-3}$.

In accordance with an embodiment of the present invention, a first electron energy state in the quantum well region is separated from a second electron energy state in the quantum well region by more than 50 meV.

In accordance with an embodiment of the present invention, the step of forming a p-type drain region further comprises the steps of: forming offset spacers on a lateral surfaces of the gate; forming gate sidewall spacers on lateral surfaces of the offset spacers; and ion implanting a set of p-type dopants into the substrate to form the drain region such that a lateral boundary of the drain region is defined on one side by a boundary of the gate sidewall spacers.

In accordance with an embodiment of the present invention, the method further comprises the step of forming a second n-type quantum well region in the substrate adjacent to the gate on an opposite side of the gate from the source region, such that the p-type drain region abuts the second n-type quantum well region.

In accordance with an embodiment of the present invention, the step of forming an n-type source region is performed concurrently with forming n-type source and drain regions in an NMOS transistor.

In accordance with an embodiment of the present invention, the step of forming an p-type drain region is performed concurrently with forming p-type source and drain regions in a PMOS transistor.

In accordance with an embodiment of the present invention, the step of forming an n-type quantum well region is performed concurrently with forming n-type lightly doped drain (NLDD) regions in an NMOS transistor.

In accordance with an embodiment of the present invention, a method of operating an IC containing a quantum well electro-optical device is provided. The quantum well electro-optical device including: a p-type substrate; a gate dielectric layer formed on a top surface of the substrate; a gate formed on a top surface of the gate dielectric layer; an n-type source region formed in the substrate adjacent to and on one side of the gate; an n-type quantum well region formed in the substrate adjacent to the gate on an opposite side of the gate from the source region; and a p-type drain region formed in the substrate abutting the quantum well region on an opposite side of the quantum well region from the gate; the method comprising the step of applying a positive potential to a gate with respect to the substrate so that an n-type inversion layer is formed under the gate.

In accordance with an embodiment of the present invention, the method further comprises the step of biasing the type source region to a negative potential with respect to the substrate, so that a current through the source region to the drain region decreases when a magnitude of the negative potential is increased.

In accordance with an embodiment of the present invention, the method further comprises the step of biasing the type source region to a negative potential with respect to the substrate, so that: electrons flowing from source region transition into an upper energy level of the quantum well region; the electrons radiatively transition into a lower energy level of the quantum well region; and the electrons tunnel to empty states in the drain region.

In accordance with an embodiment of the present invention, the method further comprises the step of biasing the type source region to a positive potential with respect to the substrate, so that: an electron in a bound state in the drain region tunnels into a bottom energy level in the quantum well region; the electron absorbs an incident photon, the photon having an energy substantially equal to an energy difference between the bottom energy level and a higher energy level in the quantum well region; the electron is elevated to the higher energy level; and the electron drifts through the inversion layer to the source region.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 is a band diagram of a QWEOD formed according to an embodiment of the instant invention as depicted in FIG. 1A through FIG. 1E, operating in a photon emission mode;

FIG. 5 is a band diagram of a QWEOD formed according to an embodiment of the instant invention as depicted in FIG. 1A through FIG. 1E, operating in a photon detection mode;

DETAILED DESCRIPTION

Figure 1A:
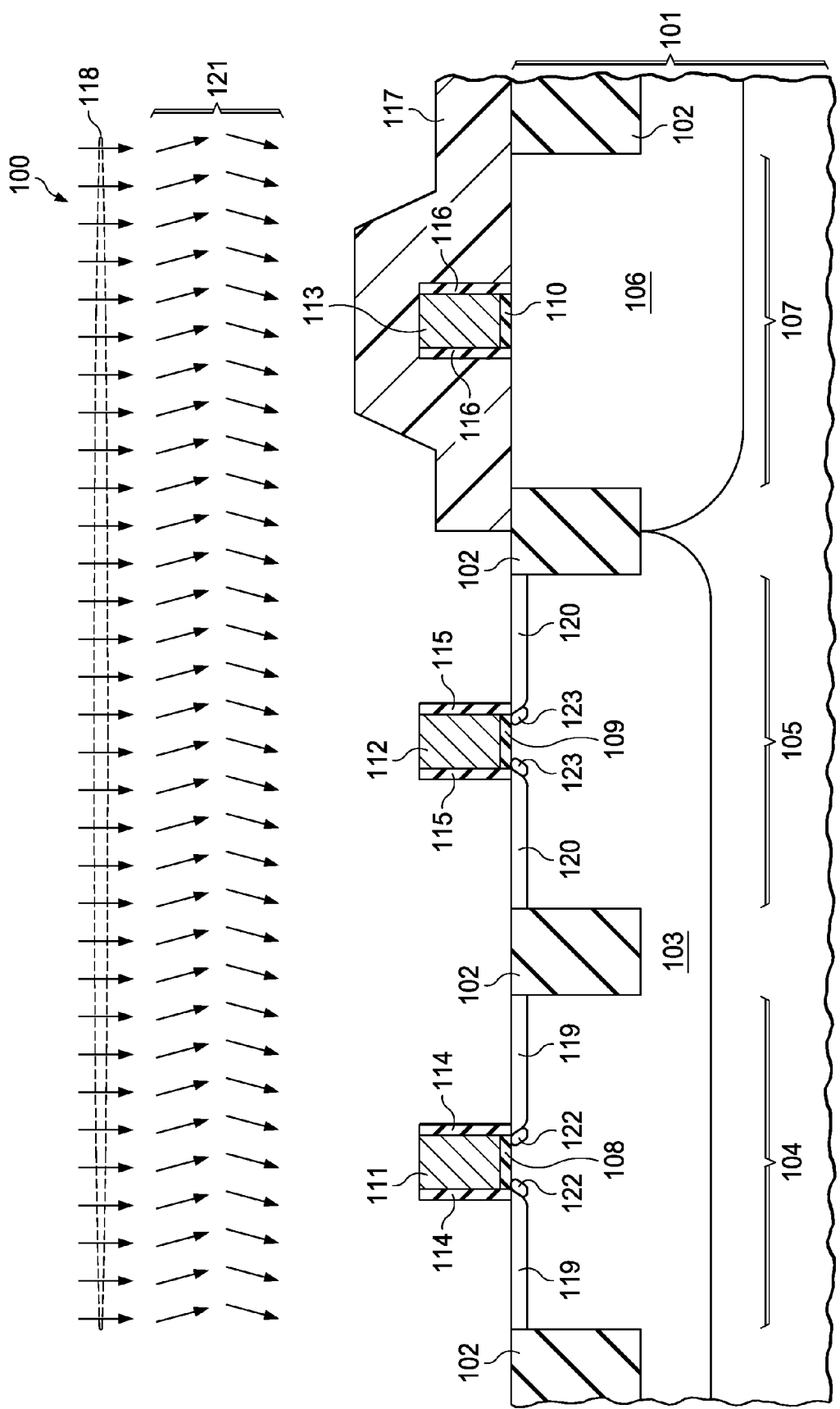
FIG. 1A through FIG. 1E are cross-sections of a CMOS IC including a QWEOD formed according to an embodiment of the instant invention, depicted in successive stages of fabrication.

Refer now to the drawings wherein depicted elements are, for the sake of clarity, not necessarily shown to scale and wherein like or similar elements are designated by the same reference numeral through the several views.

An IC is provided, containing a quantum well electro-optical device (QWEOD) which is formed in a modified NMOS transistor structure by ion implanting p-type dopants instead of n-type dopants into a drain region. A quantum well is formed in an n-type lightly doped drain (NLDD) region abutting the p-type drain region. Electrons may be transferred into, out of, and between discrete energy states in the quantum well by processes including tunneling to and from the p-type drain region, drifting through an n-type channel from an n-type source region, and photon absorption and emission. The QWEOD may be operated in a negative conductance mode, in a photon emission mode or in a photo detection mode. The QWEOD may be fabricated in a CMOS IC without adding process cost or complexity.

FIG. 1A through FIG. 1E are cross-sections of a CMOS IC including a QWEOD formed according to an embodiment of the instant invention, depicted in successive stages of fabrication. Referring to FIG. 1A, the CMOS IC 100 is formed in a semiconductor substrate 101, typically p-type single crystal silicon, less commonly a silicon-on-insulator (SOI) substrate or a hybrid orientation technology (HOT) substrate with regions of silicon or silicon-germanium with different crystal orientations. It is within the scope of the instant invention to form the QWEOD in any substrate which supports fabrication of a CMOS IC. Elements of field oxide 102 are formed by a shallow trench isolation (STI) process sequence, in which trenches, commonly 200 to 500 nanometers deep, are etched into the substrate 101, electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as a high aspect ratio process (HARP). A p-type well 103, commonly called a p-well, is formed in the substrate 101, typically by ion implanting a first set of p-type dopants, including boron and possibly gallium and/or indium, at doses from $1 \cdot 10^{11}$ to $1 \cdot 10^{14}$ atoms/cm$^2$, into a region defined for an NMOS transistor 104 and a region defined for the QWEOD 105. A p-well photoresist pattern, not shown in FIG. 1A for clarity, is commonly used to block the first set of p-type dopants from areas outside the p-well 103. The p-well 103 extends from a top surface of the substrate 101 to a depth typically 50 to 500 nanometers below a bottom surface of the field oxide elements 102. The ion implantation process to form the p-well 103 may include additional steps to implant additional p-type dopants at shallower depths for purposes of improving NMOS transistor performance, such as threshold adjustment, leakage current reduction and suppression of parasitic bipolar operation. An n-type well 106, commonly called an n-well, is formed in the substrate 101, typically by ion implanting a first set of n-type dopants, including phosphorus and arsenic, and possibly antimony, at doses from $1 \cdot 10^{11}$ to $1 \cdot 10^{14}$ atoms/cm$^2$, into a region defined for a p-channel metal oxide semiconductor (PMOS) transistor 107. An n-well photoresist pattern, not shown in FIG. 1A for clarity, is commonly used to block the first set of n-type dopants from areas outside the n-well 106. The n-well 106 extends from the top surface of the substrate 101 to a depth typically 50 to 500 nanometers below the bottom surface of the field oxide elements 102. The ion implantation process to form the n-well 106 may include additional steps to implant additional n-type dopants at shallower depths for purposes of improving PMOS transistor performance, such as threshold adjustment, leakage current reduction and suppression of parasitic bipolar operation. A sheet resistivity of the n-well 106 is commonly between 100 and 1000 ohms/square.

Still referring to FIG. 1A, an NMOS gate dielectric layer 108, typically silicon dioxide, nitrogen doped silicon dioxide, silicon oxy-nitride, hafnium oxide, layers of silicon dioxide and silicon nitride, or other insulating material, between 1 and 30 nanometers thick, is formed on a top surface of the p-well 103 in the NMOS transistor region 104 by known methods. Similarly, a QWEOD gate dielectric layer 109 and a PMOS gate dielectric layer 110, both typically the same material as the NMOS gate dielectric layer 108, are formed on a top surface of the p-well 103 in the QWEOD region 105 and on a top surface of the n-well 106 in the PMOS transistor region 107, respectively. It is common to form portions or all of the NMOS gate dielectric layer 108, QWEOD gate dielectric layer 109 and PMOS gate dielectric layer 110 concurrently. An NMOS gate 111 is formed on a top surface of the NMOS gate dielectric layer 108. At this stage of fabrication of the IC 100, the NMOS gate 111 is typically formed of polycrystalline silicon, commonly known as polysilicon, by depositing a layer of polysilicon on the top surface of the NMOS gate dielectric layer 108, forming a gate photoresist pattern to define areas for the NMOS gate 111, followed by removal of unwanted polysilicon by known etching methods. Similarly, a QWEOD gate 112 is formed on a top surface of the QWEOD dielectric layer 109 and a PMOS gate 113 is formed on a top surface of the PMOS gate dielectric layer 110, typically during formation of the NMOS gate 111. NMOS offset spacers 114, typically silicon dioxide or a layer of silicon dioxide and a layer of silicon nitride, between 1 and 10 nanometers thick, are formed on lateral surfaces of the NMOS gate 111, commonly by oxidation of the polysilicon in the NMOS gate 111 and possible conformal deposition of silicon dioxide and/or silicon nitride. Similarly, QWEOD offset spacers 115, also typically silicon dioxide or a layer of silicon dioxide and a layer of silicon nitride, between 1 and 10 nanometers thick, are formed on lateral surfaces of the QWEOD gate 112, and PMOS offset spacers 116, also typically silicon dioxide or layer of silicon dioxide and a layer of silicon nitride, between 2 and 15 nanometers thick, are formed on lateral surfaces of the PMOS gate 113. It is common for the PMOS offset spacers 116 to have a different thickness than the NMOS offset spacers 114. The QWEOD offset spacers 115 may have a different thickness from either the NMOS offset spacers 114 or the PMOS offset spacers 116.

Continuing to refer to FIG. 1A, an n-type lightly doped drain (NLDD) photoresist pattern 117 is formed on top surfaces of the n-well 106 and PMOS gate 113, using known photolithographic methods. A second set of n-type dopants 118, typically phosphorus and arsenic, and possibly antimony, is ion implanted into a top layer of the p-well 103 adjacent to the NMOS offset spacers 114 and adjacent to the QWEOD offset spacers 115, at a total dose typically between $1 \cdot 10^{13}$ and $5 \cdot 10^{14}$ atoms/cm$^2$, to a depth in the p-well 103 between 10 and 50 nanometers, to form NLDD implanted regions 119 in the NMOS transistor region 104 and QWEOD lightly doped drain (LDD) implanted regions 120 in the QWEOD region 105. The NLDD photoresist pattern 117 blocks the second set of n-type dopants 118 from areas where the second set of n-type dopants is not desired, for example, areas defined for PMOS transistors. While the NLDD photoresist pattern 117 is in place, a second set of p-type dopants 121, typically boron, a portion of which is commonly in the form BF$_2$, and possibly gallium or indium, is ion implanted into the top layer of the p-well 103, typically at a total dose between $1 \cdot 10^{12}$ and $3 \cdot 10^{13}$ atoms/cm$^2$, to form p-type NMOS halo implanted regions 122 laterally abutting the NLDD implanted regions 119 and QWEOD halo implanted regions 123 laterally abutting the QWEOD LDD implanted regions 120. The second set of p-type dopants 121 is typically ion implanted in two or four subdoses, wherein each subdose is ion implanted at an angle of 10 to 30 degrees from a vertical axis of the IC 100, and rotated about the vertical axis to provide a uniform concentration of p-type dopants in the NMOS halo implanted regions 122 on all sides of the NMOS gate 111 and in the QWEOD halo implanted regions 123 on all sides of the QWEOD gate 112. The NLDD photoresist pattern 117 is removed, commonly by exposing the IC 100 to an oxygen containing plasma, followed by a wet cleanup to remove any organic residue from the top surface of the IC 100.

Figure 1B:
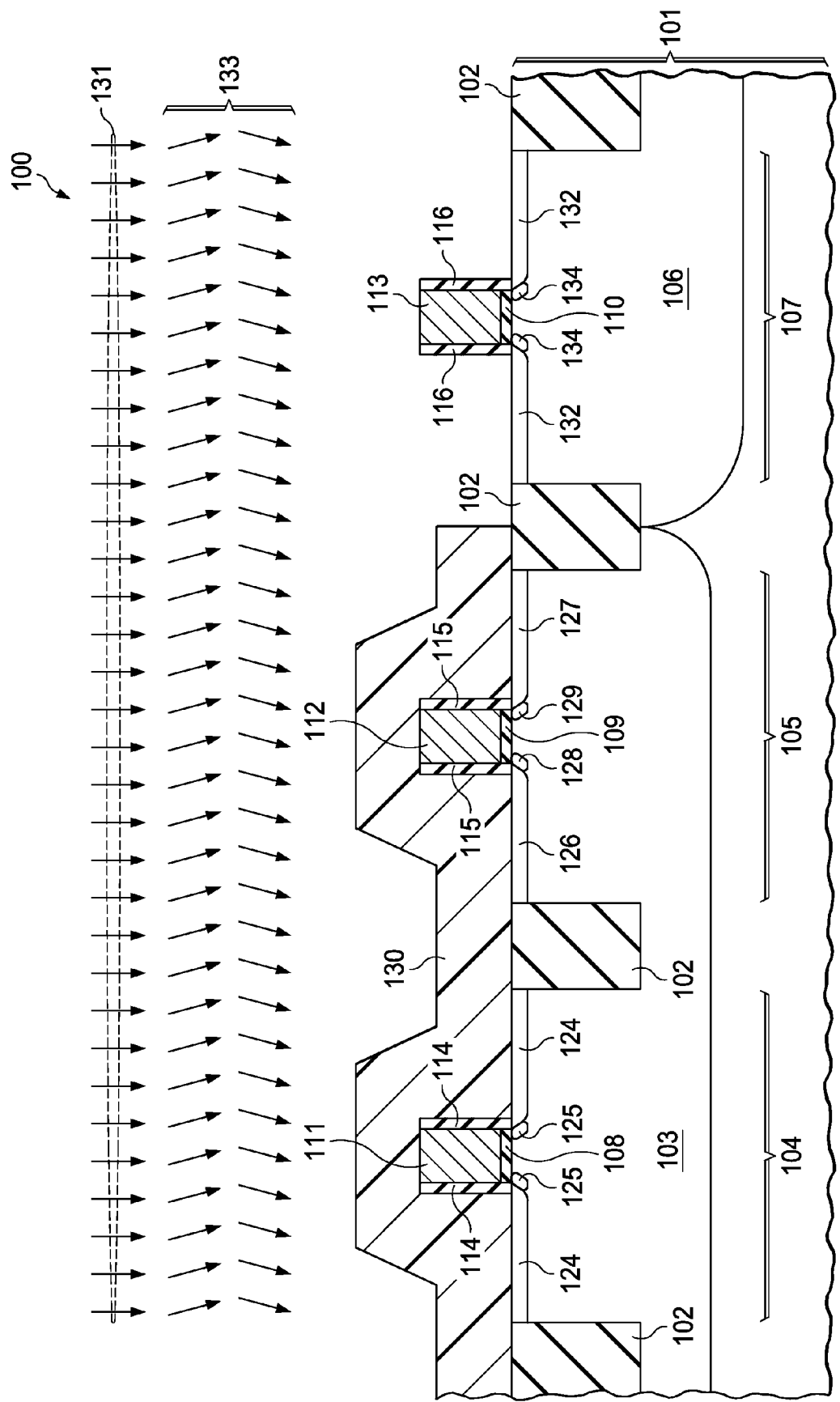

FIG. 1B depicts the IC 100 at a subsequent stage of fabrication. It is common to perform an NLDD anneal operation on the IC 100, using known methods of rapid thermal processing (RTP) or laser annealing, to activate a portion of the second set of n-type dopants and second set of p-type dopants to form NLDD annealed regions 124 and NMOS halo annealed regions 125 in the NMOS transistor region 104, and a source QWEOD LDD annealed region 126, a drain QWEOD LDD annealed region 127, a source QWEOD halo annealed region 128 and a drain QWEOD halo annealed region 129. A PLDD photoresist pattern 130 is formed on top surfaces of the p-well 103, NMOS gate 111 and QWEOD gate 112 by known photolithographic methods. A third set of p-type dopants 131, typically boron, a portion of which is commonly in the form BF$_2$, and possibly including gallium or indium, is ion implanted into a top layer of the n-well 106 adjacent to the PMOS offset spacers 116, at a total dose typically between $1 \cdot 10^{13}$ and $5 \cdot 10^{14}$ atoms/cm$^2$, to a depth in the n-well 106 between 10 and 50 nanometers, to form PLDD implanted regions 132. The PLDD photoresist pattern 130 blocks the third set of p-type dopants 131 from areas where the third set of p-type dopants is not desired, for example, the NMOS region 104 and the QWEOD region 105. A third set of n-type dopants 133, typically phosphorus, and commonly including arsenic, is ion implanted into the top layer of the n-well 106, typically at a total dose between $1 \cdot 10^{12}$ and $3 \cdot 10^{13}$ atoms/cm$^2$, to form n-type PMOS halo implanted regions 134 adjacent to the PLDD implanted regions 132. The third set of n-type dopants 133 is typically ion implanted in two or four subdoses, wherein each subdose is ion implanted at an angle of 10 to 30 degrees from a vertical axis of the IC 100, and rotated about the vertical axis to provide a uniform concentration of n-type dopants in the PMOS halo implanted regions 134 on all sides of the PMOS gate 113. The PLDD photoresist pattern 130 is removed, commonly by exposing the IC 100 to an oxygen containing plasma, followed by a wet cleanup to remove any organic residue from the top surface of the IC 100.

Figure 1C:
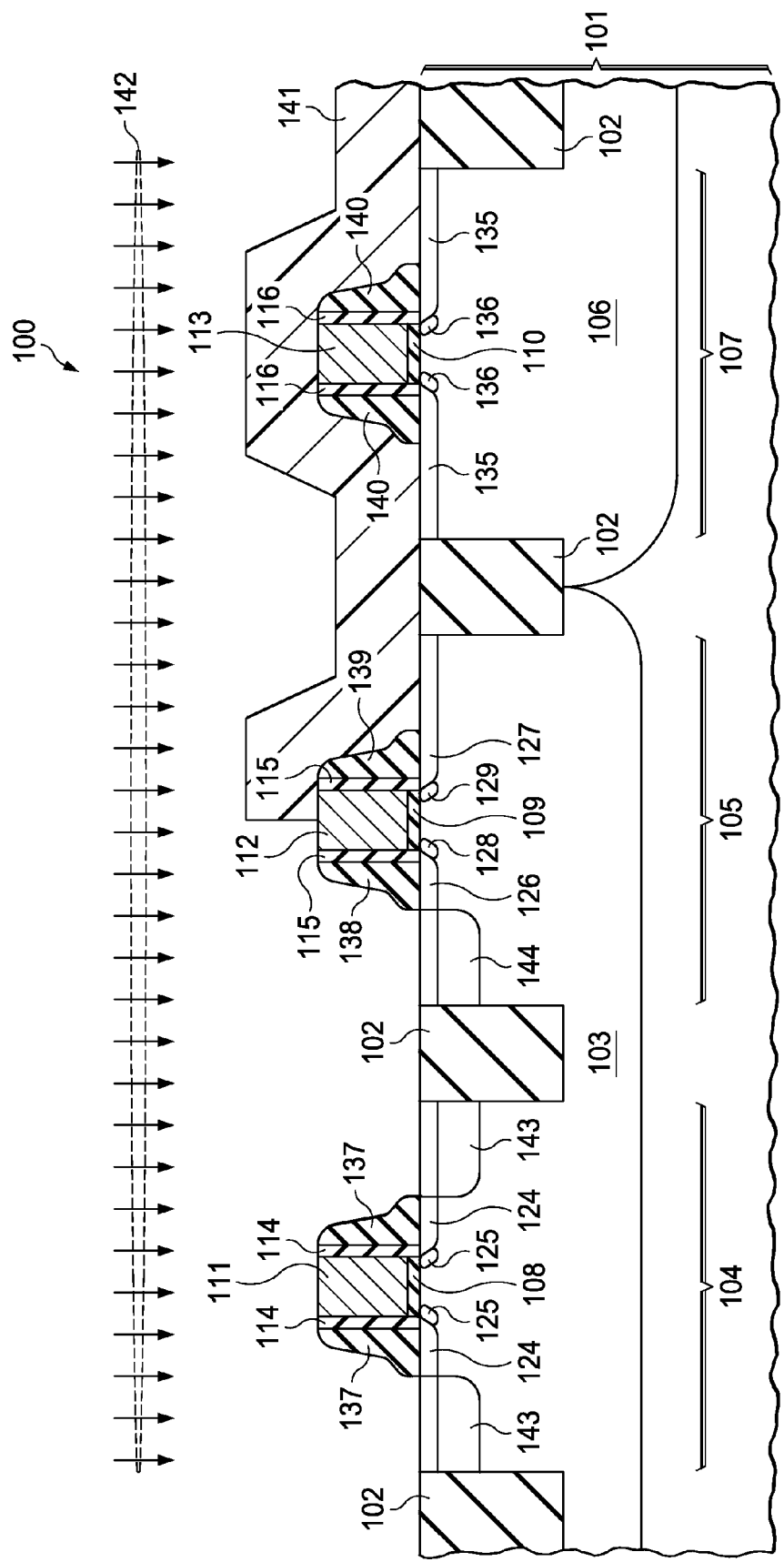

FIG. 1C depicts the IC 100 after a PLDD anneal operation, using known RTP or laser annealing methods, activates a portion of the third set of p-type dopants and third set of n-type dopants to form PLDD annealed regions 135 and PMOS halo annealed regions 136. NMOS gate sidewall spacers 137, typically silicon nitride or layers of silicon nitride and silicon dioxide, between 30 and 80 nanometers thick are formed on lateral surfaces of the NMOS offset spacers 114, commonly by known methods of conformal deposition of a layer of silicon nitride or layers of silicon nitride and silicon dioxide, followed by an anisotropic etch which removes the conformally deposited material from top surfaces of the NMOS gate 111 and NLDD annealed regions 124 to leave the NMOS gate sidewall spacers 137 on the lateral surfaces of the NMOS offset spacers 114 and the top surface of the p-well 103 immediately adjacent to the NMOS offset spacers 114. Similarly, a source QWEOD gate sidewall spacer 138, a drain QWEOD gate sidewall spacer 139 and PMOS gate sidewall spacers 140, of similar materials and dimensions to the NMOS gate sidewall spacers 137, are formed on lateral surfaces of the QWEOD offset spacers 115 and on lateral surfaces of the PMOS offset spacers 116, respectively. An n-type source/drain (NSD) photoresist pattern 141 is formed on top surfaces of the PLDD annealed regions 135, PMOS gate 113, and the drain QWEOD LDD annealed region 127. A fourth set of n-type dopants 142, typically phosphorus, and commonly including arsenic, is ion implanted into the top region of the p-well 106 adjacent to the NMOS gate sidewall spacers 137 and adjacent to the source QWEOD gate sidewall spacer 138, and into a portion of the QWEOD gate 112, at a total dose typically between $1 \cdot 10^{14}$ and $5 \cdot 10^{16}$ atoms/cm$^2$, to a depth in the p-well 103 between 25 and 250 nanometers, to form NMOS NSD implanted regions 143 and a QWEOD source implanted region 144. The NSD photoresist pattern 141 blocks the fourth set of n-type dopants 142 from areas where the fourth set of n-type dopants is not desired, for example, the drain side of the QWEOD region 105 and areas defined for PMOS transistors. The NSD photoresist pattern 141 is removed, commonly by exposing the IC 100 to an oxygen containing plasma, followed by a wet cleanup to remove any organic residue from the top surface of the IC 100.

Figure 1D:
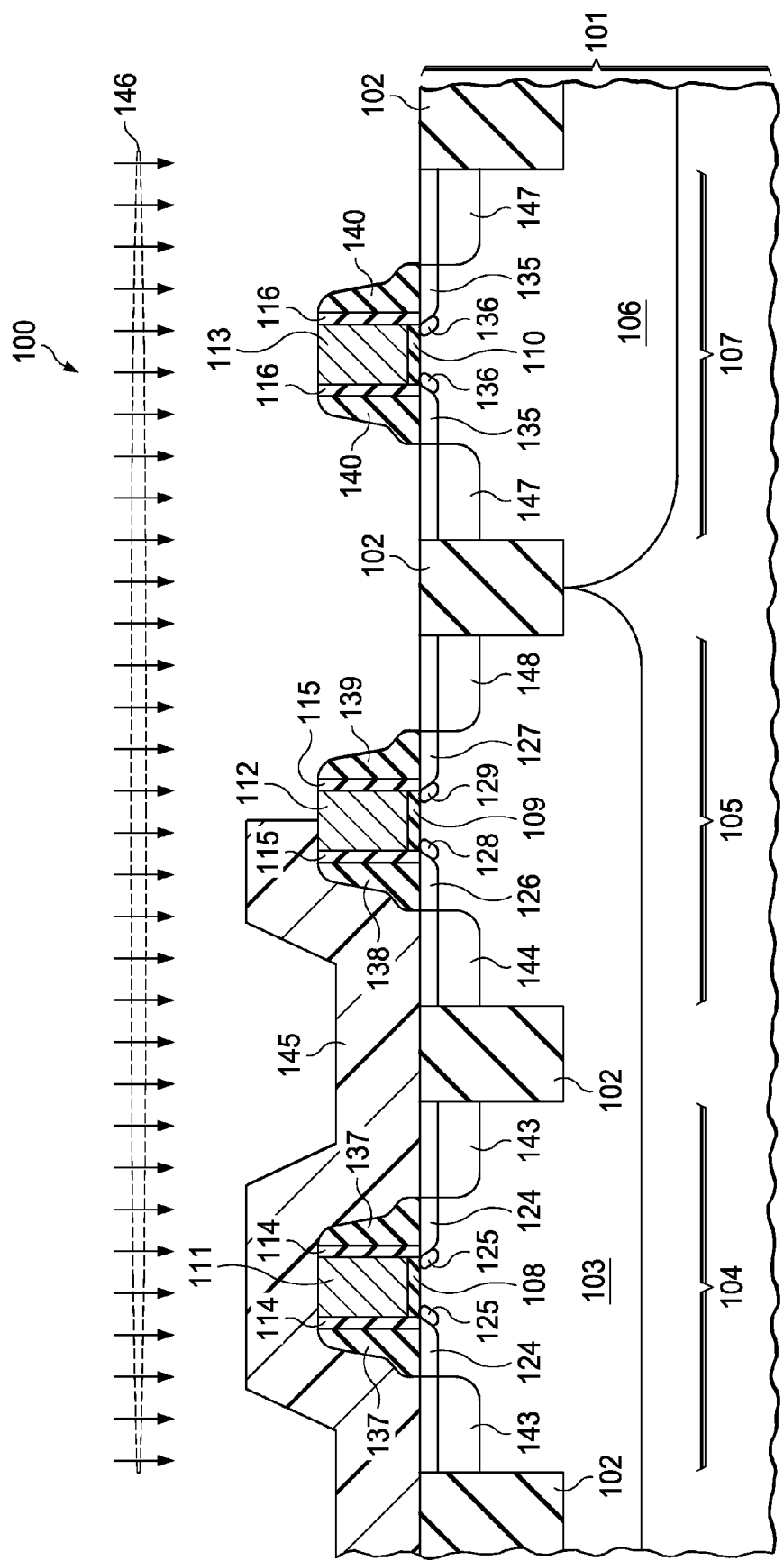

FIG. 1D depicts the IC 100 during a subsequent p-type source/drain (PSD) ion implantation process. A PSD photoresist pattern 145 is formed on the top surface of the source QWEOD LDD annealed region 126, the NMOS LDD annealed regions 124 and NMOS gate 111, using known photolithographic methods. A fourth set of p-type dopants 146, typically boron, and possibly gallium or indium, is ion implanted into the top region of the n-well 106 adjacent to the PMOS gate sidewall spacers 140 and into the top region of the p-well 103 adjacent to the drain QWEOD gate sidewall spacer 139, and into a portion of the QWEOD gate 112, at a total dose typically between $1 \cdot 10^{14}$ and $5 \cdot 10^{16}$ atoms/cm$^2$, to a depth in the p-well 103 and n-well 106 between 25 and 250 nanometers, to form PSD implanted regions 147 in the PMOS region 107 and a p-type QWEOD drain implanted region 148 in the QWEOD region 105. The drain QWEOD LDD annealed region 127 is overlapped by the QWEOD drain implanted region 148. The PSD photoresist pattern 145 is removed, commonly by exposing the IC 100 to an oxygen containing plasma, followed by a wet cleanup to remove any organic residue from the top surface of the IC 100.

Figure 1E:
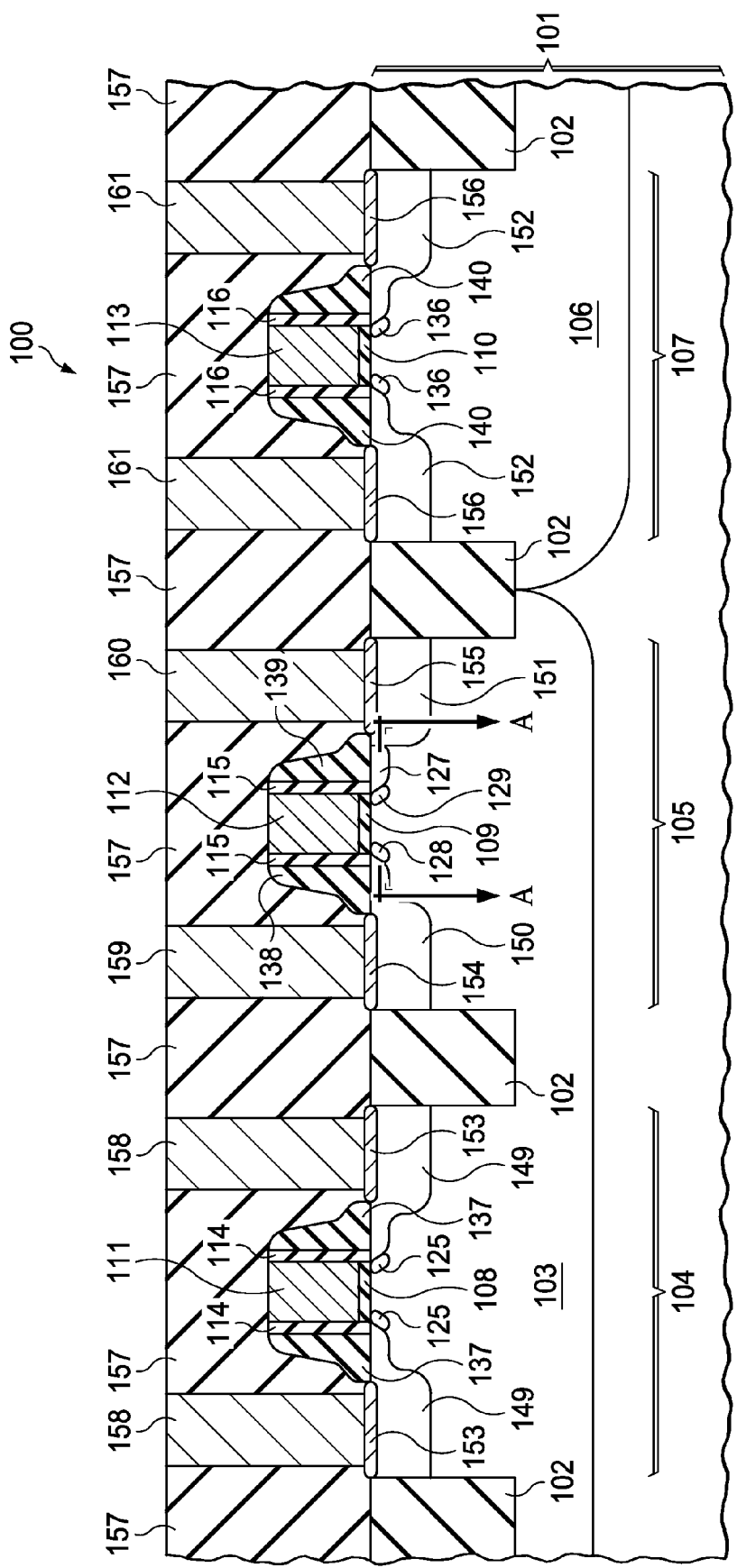

FIG. 1E depicts the IC 100 after fabrication of the NMOS transistor, QWEOD and PMOS transistor is substantially completed, and contacts have been formed on the source and drain nodes of the NMOS transistor, QWEOD and PMOS transistor. A source/drain anneal operation is performed on the IC 100 using known RTP or laser annealing methods which activates a portion of the fourth set of n-type dopants and fourth set of p-type dopants to form NSD regions 149 in the NMOS transistor region 104 which include the NLDD annealed regions 124 and NSD implanted regions 143 depicted in FIG. 1D. The source/drain anneal operation also forms an n-type QWEOD source region 150, which includes the source QWEOD LDD annealed region 126 and n-type QWEOD source implanted region 144 depicted in FIG. 1D. The source/drain anneal operation also forms a p-type QWEOD drain region 151 which includes the QWEOD drain implanted region 148 depicted in FIG. 1D. The drain QWEOD LDD annealed region 127 is between, and makes contact with, the QWEOD drain region 151 and the drain QWEOD halo annealed region 129. The source/drain anneal operation also forms PSD regions 152 in the PMOS transistor region 107 which include the PLDD annealed regions 135 and PSD implanted regions 147 depicted in FIG. 1D. The source/drain anneal causes n-type dopants and p-type dopants in the QWEOD gate 112 to mix to some extent.

Still referring to FIG. 1E, it is common to replace the polysilicon in the NMOS gate 111, QWEOD gate 112 and PMOS gate 113 with a metal or a metal silicide, by an appropriate known method. For example, the polysilicon may be replaced with nickel silicide by depositing a layer of nickel on the top surfaces of the NMOS gate 111, QWEOD gate 112 and PMOS gate 113 and heating the IC 100 to react the polysilicon with the nickel to form nickel silicide, followed by selective removal of unreacted nickel, commonly by a wet etch process. Metal silicide layers are formed on the NSD regions 149, QWEOD source region 150, QWEOD drain region 151, and PSD regions 152 by known methods, including depositing of a metal layer on a top surface of the IC 100, heating the IC 100 to react the metal with exposed silicon to form metal silicide, and selective removal of unreacted metal, to leave NSD silicide layers 153, a QWEOD source silicide layer 154, a QWEOD drain silicide layer 155 and PSD silicide layers 156.

Continuing to refer to FIG. 1E, a pre-metal dielectric (PMD) layer 157, typically a dielectric layer stack including a silicon nitride or silicon dioxide PMD liner 10 to 100 nanometers thick deposited by plasma enhanced chemical vapor deposition (PECVD), a layer of silicon dioxide, phospho-silicate glass (PSG) or boro-phospho-silicate glass (BPSG), commonly 100 to 1000 nanometers thick deposited by PECVD, commonly leveled by a chemical-mechanical polish (CMP) process, and an optional PMD cap layer, commonly 10 to 100 nanometers of a hard material such as silicon nitride, silicon carbide nitride or silicon carbide, is formed on a top surface of the IC 100. NMOS source and drain contacts 158, a QWEOD source contact 159, a QWEOD drain contact 160 and PMOS source and drain contacts 161, which make electrical connections to the NSD silicide layers 153, QWEOD source silicide layer 154, a QWEOD drain silicide layer 155 and PSD silicide layers 156, respectively, are formed in the PMD layer 157 by known methods, including forming a contact photoresist pattern, not shown in FIG. 1E for clarity, on a top surface of the PMD layer 157 which exposes areas for contacts, etching contact holes through the PMD layer 157 to expose silicide layers on the IC 100 and filling the contact holes with a contact liner metal and a contact fill metal, typically tungsten. Contacts are also formed to make electrical connections to the NMOS gate 111, QWEOD gate 112 and PMOS gate 113, but are not shown in FIG. 1E for clarity.

The n-type drain QWEOD LDD annealed region 127 is surrounded by p-type regions, and forms a quantum well which confines electrons in a conduction band. In a preferred embodiment, a doping density in the quantum well is more than $10^{19}$ cm$^{-3}$, which results in a Fermi level being within a few meV of the conduction band. In a preferred embodiment, the p-type drain QWEOD halo region 129 and p-type QWEOD drain region 151 which abut the quantum well have doping densities more than $10^{16}$ cm$^{-3}$, which results in the Fermi level being within 300 meV of the valence band. Thus a quantum well depth may be more than 700 meV.

Formation of a QWEOD as recited in reference to FIG. 1A through FIG. 1E is advantageous because the QWEOD may be incorporated into CMOS ICs without adding fabrication cost or complexity.

Figure 2:
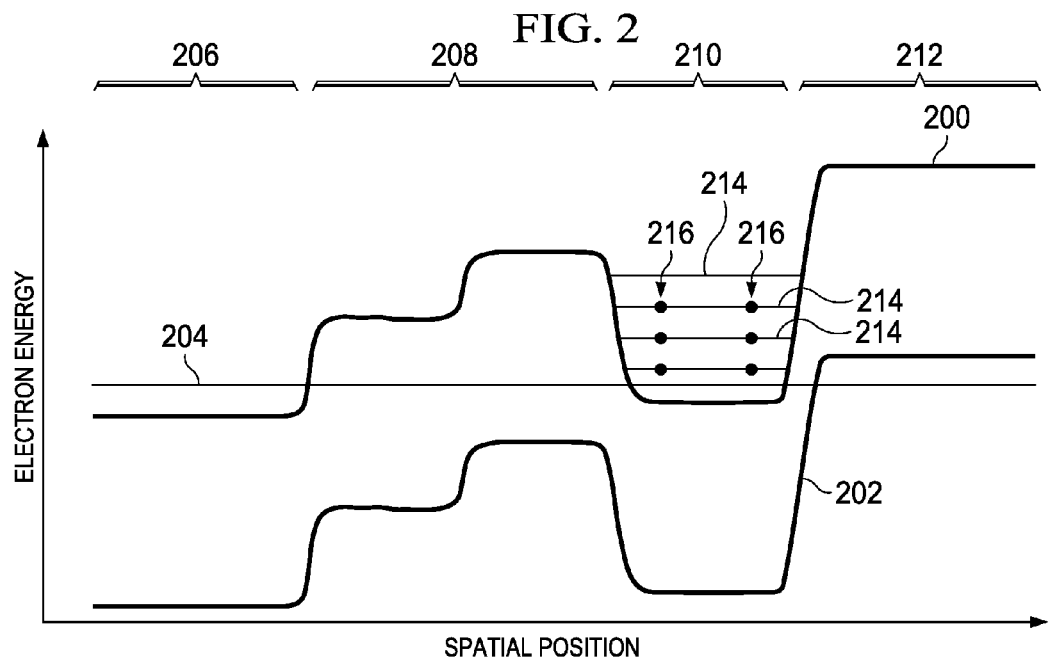
FIG. 2 is an energy band diagram of QWEOD elements.

FIG. 2 is an energy band diagram of QWEOD elements, for example along section line A-A in FIG. 1E, in which a QWEOD gate is biased to a flatband condition with respect to an underlying p-type substrate, and a drain node is biased to zero volts with respect to the p-type substrate. The energy band diagram plots a conduction band edge 200, a valence band edge 202 and a Fermi level 204 along a lateral section line through a source region 206, a channel region 208 under the gate, a quantum well 210 in a drain side NLDD region, and a p-type QWEOD drain region 212. The source region 206 is n-type. A dopant density in the source region 206 adjacent to the channel region 208 is preferably more than $10^{19}$ cm$^{-3}$, which results in the Fermi level 204 being a few meV higher than the conduction band edge 200. The conduction band 200 in the channel region 208 is lower adjacent to the source region 206 due to a higher density of n-type dopants in that portion of the gate compared to a portion of the gate adjacent to the quantum well 210. The QWEOD drain region 212 is degenerately doped, causing the valence band edge 202 be a few meV higher than the Fermi level 204. The quantum well region 210 is n-type with a dopant density preferably more than $10^{19}$ cm$^{-3}$, which results in the Fermi level 204 being a few meV higher than the conduction band edge 200. A potential well for electrons is formed because the conduction band edge 200 is higher in all regions surrounding the quantum well region 210.

Still referring to FIG. 2, those familiar with quantum well devices will recognize that electron energy states 214 in the quantum well region 210 are quantized, and that separations between the electron energy states increase as a lateral width of the quantum well region 210 decrease. Electrons 216 may occupy the electron energy states 214. Embodiments of the instant invention wherein a quantum well region has a width less than 15 nanometers may support electron energy states with separations more than 50 meV. Such quantum wells would allow transfer of electrons into and out of selected individual electron energy states at room temperature.

A QWEOD fabricated as recited in reference to FIG. 1A through FIG. 1E is furthermore advantageous because the quantum well holds an amount of charge which may be precisely controlled by known fabrication methods. Multiple instances of quantum wells fabricated according to the embodiment described herein with customary fabrication process tolerances will contain the same number of electrons, because of separation of electron energy levels by more than 50 meV.

Figure 3:
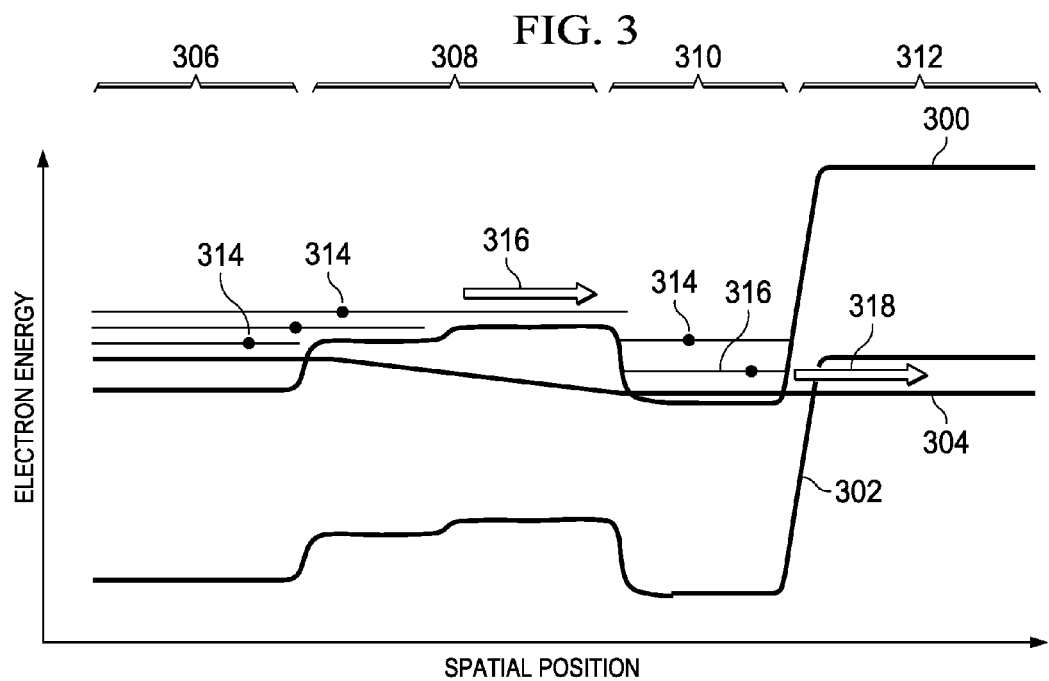
FIG. 3 is a band diagram of a QWEOD formed according to an embodiment of the instant invention as depicted in FIG. 1A through FIG. 1E, operating in a negative conductance mode.

FIG. 3 is a band diagram of a QWEOD formed according to an embodiment of the instant invention as depicted in FIG. 1A through FIG. 1E, operating in a negative conductance mode. The energy band diagram plots a conduction band edge 300, a valence band edge 302 and a Fermi level 304 along a lateral line through a source region 306, a channel region 308 under the gate, a quantum well 310 in a drain side NLDD region, and a p-type QWEOD drain region 312. The source region 306 is biased to a negative potential with respect to a p-type substrate under the source region 306 and channel region 308. The gate is biased positively with respect to the substrate, so that an inversion layer is formed in the channel region 308. Electrons 314 in the source region 306 diffuse into the channel region 308 and drift to the quantum well 310, as depicted by drift process 316. Electrons 314 in the quantum well 310 fall to a bottom energy state 316 and tunnel, as depicted by tunnel process 318, to energy states at the valence band edge 302 in the drain region 312. Efficient charge transfer through the tunnel process 318 depends on alignment of the bottom energy state 316 with vacant states (holes) under the valence band edge 302 in the drain region 312. Increasing the bias on the source region 306 may cause misalignment of the bottom energy state 316 with the vacant states, reducing current flow through the QWEOD. The phenomenon of reduced current at increased bias is known as negative conductance, and is useful in a variety of oscillator and amplifier circuits. Forming a QWEOD as described in reference to FIG. 1A through FIG. 1E to operate in a negative conductance mode is advantageous because separation of the bottom electron energy level 316 from upper energy levels is consistent between instances of the QWEOD fabricated with usual tolerances of CMOS ICs, providing a consistent current-voltage relationship across instances of the QWEOD.

FIG. 4 is a band diagram of a QWEOD formed according to an embodiment of the instant invention as depicted in FIG. 1A through FIG. 1E, operating in a photon emission mode. The energy band diagram plots a conduction band edge 400, a valence band edge 402 and a Fermi level 404 along a lateral line through a source region 406, a channel region 408 under the gate, a quantum well 410 in a drain side NLDD region, and a p-type QWEOD drain region 412. The source region 406 is biased to a negative potential with respect to a p-type substrate under the source region 406 and channel region 408. The gate is biased positively with respect to the substrate, so that an inversion layer is formed in the channel region 408. Electrons 414 in the source region 406 diffuse into the channel region 408 and drift to the quantum well 410, as depicted by drift process 416. Electrons 414 reaching the quantum well 410 transition into an upper energy level 418, then radiatively transition into a lower energy level 420 through a radiative process 422, emitting a photon 424. Electrons 414 in the lower energy level 420 tunnel to empty states (holes) in the drain region 412. Bias on the source region 406 is adjusted to maintain defined occupation levels of the upper energy level 418 and lower energy level 420 so as to produce desired photon emission rates.

FIG. 5 is a band diagram of a QWEOD formed according to an embodiment of the instant invention as depicted in FIG. 1A through FIG. 1E, operating in a photon detection mode. The energy band diagram plots a conduction band edge 500, a valence band edge 502 and a Fermi level 504 along a lateral line through a source region 506, a channel region 508 under the gate, a quantum well 510 in a drain side NLDD region, and a p-type QWEOD drain region 512. The source region 506 is biased to a positive potential with respect to a p-type substrate under the source region 506 and channel region 508. The gate is biased positively with respect to the substrate, so that an n-type inversion layer is formed in the channel region 508. Biasing the source region 506 positive and forming an inversion layer connecting the quantum well 510 to the source region 506 may drop a bottom energy level 514 in the quantum well 510 to drop below the Fermi level 504. An electron 516 in a bound state in the drain region 512 may tunnel into the bottom energy level 514 as depicted by tunnel process 518. An incident photon 520 with 522 in the quantum well 510 may be absorbed by the electron 516 in the bottom energy level 514, causing the electron 516 to be elevated to the higher energy level 522 as depicted by excitation process 524. Biasing the source region 506 positive may cause the electron 516 in the higher energy level 522 to drift to the source region 506, as depicted by drift process 526.

Figure 6A:
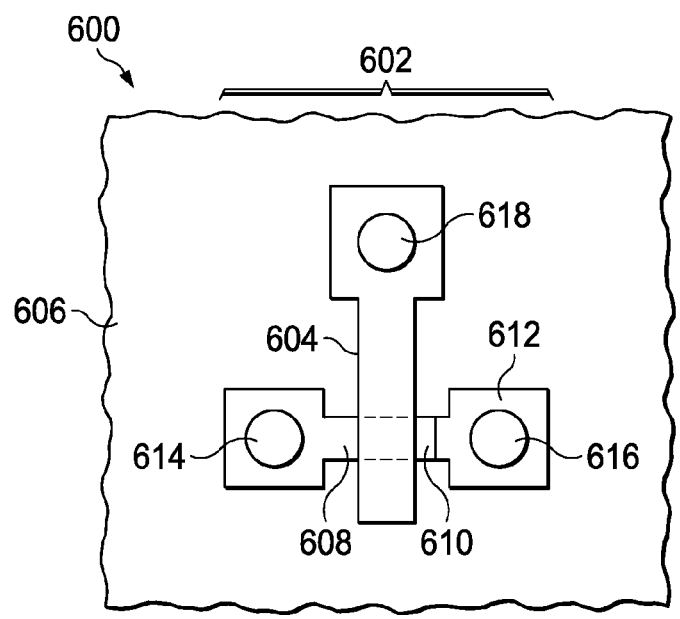
FIG. 6A through FIG. 6C are top views of embodiments of ICs containing the instant invention, depicting a quantum dot device, a quantum wire device and a parallel quantum dot device, respectively.
Figure 6B:
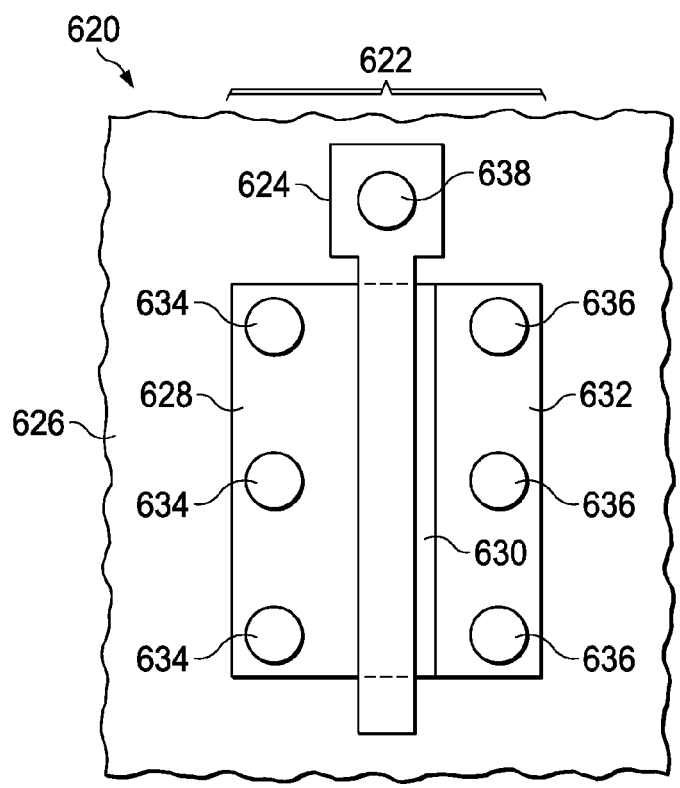
Figure 6C:
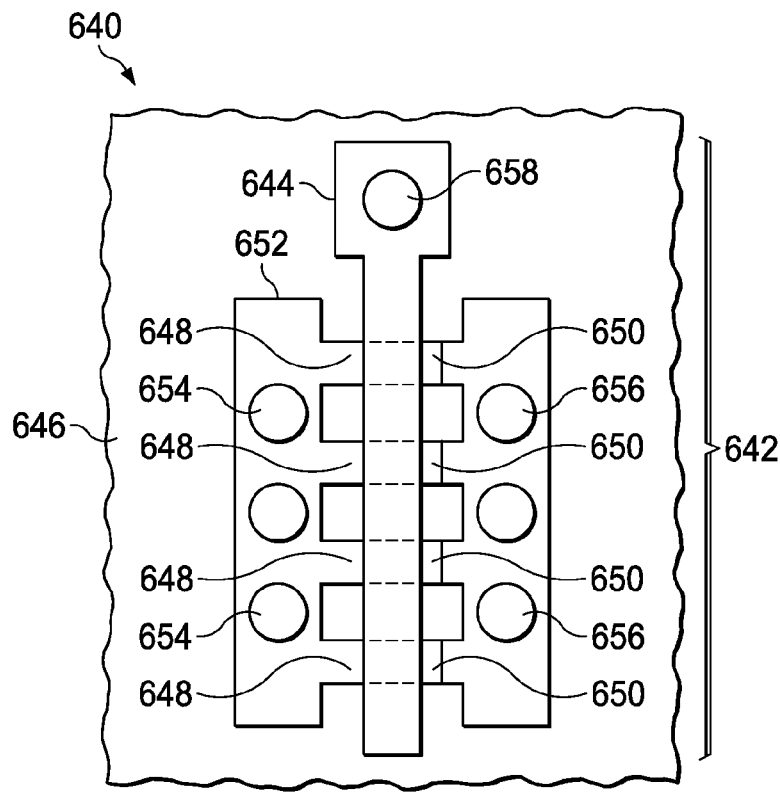

The quantum wells in the embodiments discussed above may be in the form commonly known as quantum dots, in which both lateral dimensions, length and width, are less than 15 nanometers. Other embodiments may have lengths of quantum wells longer than their widths. For example, the quantum wells may be in the form commonly known as quantum wires, in which a width is less than 15 nanometers while a length is significantly longer than 15 nanometers, for example, longer than 50 nanometers. FIG. 6A through FIG. 6C are top views of embodiments of ICs containing the instant invention, depicting a quantum dot device, a quantum wire device and a parallel quantum dot device, respectively. Referring to FIG. 6A, an IC 600 containing a quantum dot device 602 includes a gate 604 formed over field oxide 606. An n-type source region 608 has a width less than 15 nanometers where it crosses the gate 604. An n-type QWEOD LDD region 610 which contains a quantum well is less than 15 nanometers wide and less than 15 nanometers long. A p-type drain region 612 abuts the QWEOD LDD region 610. A source contact 614 and a drain contact 616 make electrical connections to the source region 608 and drain region 612, respectively, and a gate contact 618 makes an electrical connection to the gate 604. A quantum well in the form of a quantum dot with lateral dimensions less than 15 nanometers is advantageous in that energy states in such a quantum dot may be accessed individually at room temperature, and precise amounts of charge may be extracted using circuits with voltage tolerances of a few millivolts. Quantum dots formed with customary CMOS IC fabrication tolerance may be expected to hold equal amounts of charge.

Referring to FIG. 6B, an IC 620 containing a quantum wire device 622 includes a gate 624 formed over field oxide 626. An n-type source region 628 has a width greater than 50 nanometers where it crosses the gate 624. An n-type QWEOD LDD region 630 which contains a quantum well is less than 15 nanometers wide and more than 50 nanometers long. A p-type drain region 632 abuts the QWEOD LDD region 630. Source contacts 634 and drain contacts 636 make electrical connections to the source region 628 and drain region 632, respectively, and a gate contact 638 makes an electrical connection to the gate 624. A quantum well in the form of a quantum wire is advantageous in that quantum states, for holes or electrons, are distributed in bands containing precise amounts of charge which may be accessed individually at room temperature. A quantum wire is furthermore advantageous because more charge may be stored in a quantum wire configuration per quantum device than in a quantum dot.

Referring to FIG. 6C, an IC 640 containing a parallel quantum dot device 642 includes a gate 644 formed over field oxide 646. An n-type source region 648 has a width less than 15 nanometers where it crosses the gate 644 at multiple locations. N-type quantum well LDD regions 650, which each contain a quantum well, are less than 15 nanometers wide and less than 15 nanometers long. A p-type drain region 652 abuts the quantum well LDD regions 650. One or more source contacts 654 and one or more drain contacts 656 make electrical connections to the source region 648 and drain region 652, respectively, and a gate contact 658 makes an electrical connection to the gate 644. The quantum wells formed in the instant embodiment exhibit advantages recited above in reference to FIG. 6A. It will be recognized by those familiar with CMOS IC design and fabrication that parallel quantum wire devices may be fabricated in a similar manner to the parallel quantum dot device described herein.

Figure 7A:
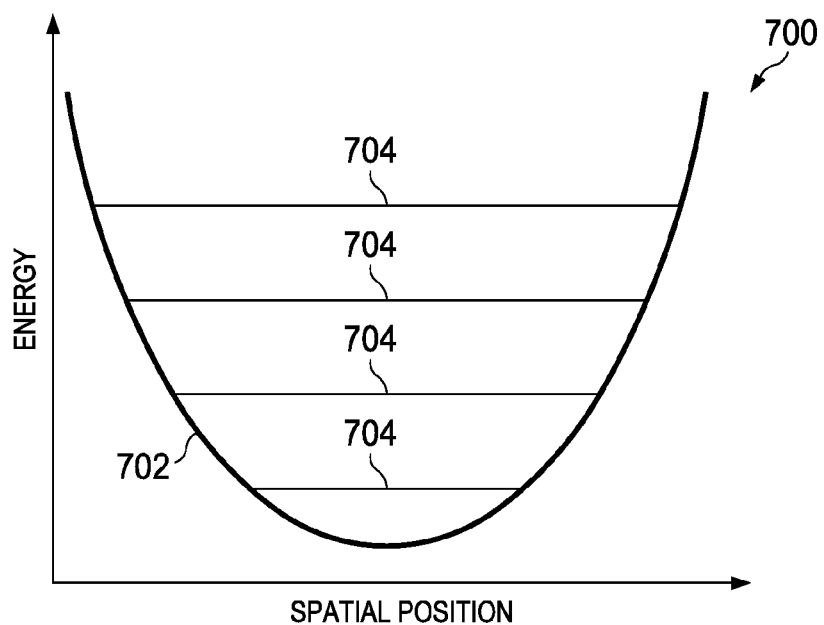
FIG. 7A and FIG. 7B are band diagrams depicting energy levels for a quantum dot and a quantum wire, respectively.
Figure 7B:
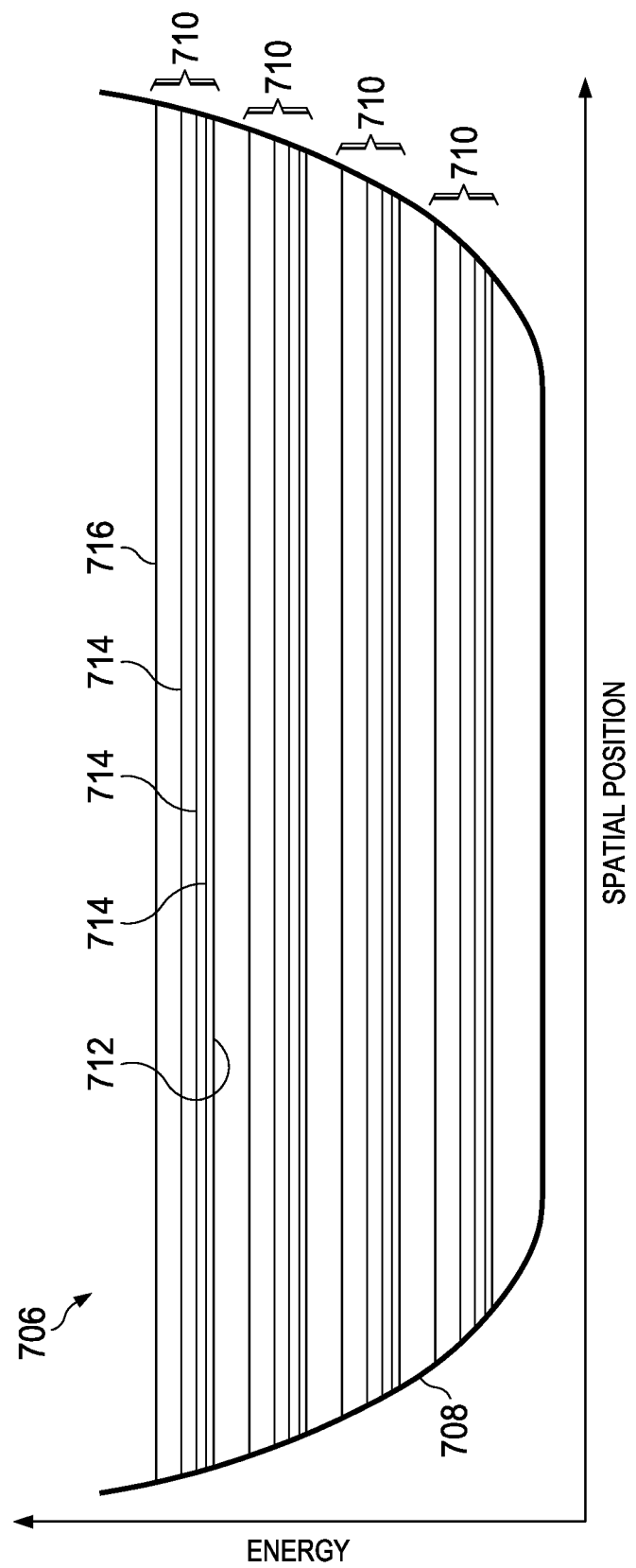

FIG. 7A and FIG. 7B are band diagrams depicting energy levels for a quantum dot and a quantum wire, respectively. Referring to FIG. 7A, a quantum dot band diagram 700 plots a quantum dot conduction band edge 702 in a quantum well region as a function of spatial position. The quantum dot quantum well contains several discrete energy levels 704 which are separated by regions commonly known as forbidden energy gaps. Separation of the discrete energy levels 704 is a function of dimensions of the quantum dot and a shape of the quantum dot conduction band edge 702. For example, quantum dots with substantially parabolic shaped quantum wells have substantially equal separations between adjacent energy levels, which is advantageous in some applications. In another example, quantum dots with substantially rectangular shaped quantum wells have increasing separation between energy levels at higher energy values, which is advantageous in other applications. Each discrete energy level (704) contains two electrons when filled.

Referring to FIG. 7B, a quantum wire band diagram 706 plots a quantum wire conduction band edge 708 in a quantum well region as a function of spatial position. The quantum wire quantum well contains several discrete energy bands 710 which are separated by forbidden energy gaps. Separation of the discrete energy bands 710 is a function of a width of the quantum wire, that is, the narrower lateral dimension of the quantum wire, and a shape of the quantum wire conduction band edge 708 across the width of the quantum wire. For example, quantum wires with substantially parabolic shaped quantum wells across the width dimension have substantially equal separations between adjacent energy levels, which is advantageous in some applications. In another example, quantum wires with substantially rectangular shaped quantum wells across the width dimension have increasing separation between energy levels at higher energy values, which is advantageous in other applications. Within each discrete energy band 710, there are several discrete energy levels, including a lowest discrete energy level 712, intermediate discrete energy levels 714 and a highest discrete energy level 716. The number of discrete energy levels 712, 714, 716 in each discrete energy band 710 is a function of a length of the quantum wire. Each discrete energy level 712, 714, 716 contains two electrons when filled. Longer quantum wires generally have more discrete energy levels in each discrete energy band than shorter quantum wires, when all other dimensions and properties are substantially equal.

Those familiar with quantum devices will recognize that the foregoing explanation of the density of electron energy levels in n-type quantum wells may be applied to whole energy levels in p-type quantum wells. P-type quantum wells may be formed in a modified PMOS transistor by a process flow analogous to the sequence described in reference to FIG. 1A through FIG. 1E, with appropriate changes in polarity of the components. The modified PMOS transistor may be formed in an n-well, and include a p-type source region, a p-type LDD region which forms the quantum well, and an n-type drain region.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

What is claimed is:

1. A method comprising
providing a p-type substrate;
forming a gate dielectric layer on a top surface of the substrate;
forming a gate on a top surface of the gate dielectric layer;
forming an n-type source region in the substrate adjacent to and on one side of the gate;
forming an n-type quantum well region in the substrate adjacent to the gate on an opposite side of the gate from the source region; and
forming a p-type drain region in the substrate abutting the quantum well region on an opposite side of the quantum well region from the gate;
wherein the method further comprises the step of forming a p-type halo region with a doping density between $1 \cdot 10^{17}$ and $1 \cdot 10^{18}$ cm−3 in the substrate under the gate and abutting the quantum well region;
in which a width of the quantum well region is less than 15 nanometers;
in which the step of forming the quantum well region is performed such that a doping density of the quantum well region is above $1 \cdot 10^{19}$ cm−3;
in which a first electron energy state in the quantum well region is separated from a second electron energy state in the quantum well region by more than 50 meV;
in which the step of forming a p-type drain region further comprises the steps of:
 forming offset spacers on a lateral surfaces of the gate;
 forming gate sidewall spacers on lateral surfaces of the offset spacers; and
 ion implanting a set of p-type dopants into the substrate to form the drain region such that a lateral boundary of the drain region is defined on one side by a boundary of the gate sidewall spacers; and
in which the step of forming an n-type quantum well region is performed concurrently with forming n-type lightly doped drain (NLDD) regions in an NMOS transistor.

* * * * *